(12) United States Patent
Bayerer

(10) Patent No.: US 7,800,213 B2
(45) Date of Patent: Sep. 21, 2010

(54) POWER SEMICONDUCTOR CIRCUIT WITH BUSBAR SYSTEM

(75) Inventor: Reinhold Bayerer, Warstein (DE)

(73) Assignee: Infineon Technologies AG, Munich (DE)

( * ) Notice: Subject to any disclaimer, the term of this patent is extended or adjusted under 35 U.S.C. 154(b) by 86 days.

(21) Appl. No.: 11/549,779

(22) Filed: Oct. 16, 2006

(65) Prior Publication Data

US 2007/0114665 A1 May 24, 2007

Related U.S. Application Data

(63) Continuation of application No. PCT/EP2005/000962, filed on Feb. 1, 2005.

(30) Foreign Application Priority Data

Apr. 16, 2004 (DE) .................. 10 2004 018 469

(51) Int. Cl.
*H01L 23/22* (2006.01)
*H01L 23/24* (2006.01)
*H01L 23/52* (2006.01)
*H01L 23/12* (2006.01)
*H01L 23/053* (2006.01)
*H01L 23/34* (2006.01)
*H01L 23/50* (2006.01)
*H01L 23/528* (2006.01)

(52) U.S. Cl. .............. 257/691; 257/E23.153; 257/714; 257/687; 257/E23.079; 257/700

(58) Field of Classification Search .......... 361/677, 361/699, 714, 711, 713, 715–722, 702; 257/687, 257/691, 700, 714, E23.079, E23.153

See application file for complete search history.

(56) References Cited

U.S. PATENT DOCUMENTS

| 4,700,273 | A |   | 10/1987 | Kaufman ................ 361/388 |
| 5,111,280 | A | * | 5/1992 | Iversen ................. 257/713 |
| 5,856,913 | A |   | 1/1999 | Heilbronner ............ 361/760 |
| 6,060,772 | A |   | 5/2000 | Sugawara et al. ........ 257/678 |
| 6,115,270 | A | * | 9/2000 | Yamane et al. .......... 363/40 |

(Continued)

FOREIGN PATENT DOCUMENTS

DE             19935803        7/1999

(Continued)

OTHER PUBLICATIONS

Fillon et al. "A High Performance Polymer Thin Film Power Electronics Packaging Technology" Advancing Microelectronics (pp. 7-12), Oct. 2003.

(Continued)

*Primary Examiner*—Phat X Cao
*Assistant Examiner*—Diana C Garrity
(74) *Attorney, Agent, or Firm*—Coats & Bennett, P.L.L.C.

(57) ABSTRACT

A power semiconductor circuit has a power semiconductor module (2) embodied as a flat assembly. A particularly compact and space-saving production of a power semiconductor circuit may be achieved with the possibilities provided by an embodiment of the power semiconductor module, whereby the power semiconductor module (2) is arranged directly on a top track (3) of a power supply and/or output tracking (11) and a cooling device (5) is integrated in the tracking (11).

16 Claims, 1 Drawing Sheet

U.S. PATENT DOCUMENTS

| | | | |
|---|---|---|---|
| 6,295,201 B1 | 9/2001 | Ogden et al. | 361/701 |
| 6,373,705 B1* | 4/2002 | Koelle et al. | 361/720 |
| 6,650,544 B1* | 11/2003 | Lai | 361/700 |
| 2001/0038143 A1* | 11/2001 | Sonobe et al. | 257/690 |
| 2002/0173192 A1 | 11/2002 | Heilbronner | 439/329 |
| 2003/0218057 A1* | 11/2003 | Joseph et al. | 228/183 |
| 2007/0175656 A1* | 8/2007 | Auerbach et al. | 174/260 |

FOREIGN PATENT DOCUMENTS

| | | |
|---|---|---|
| DE | 10129006 A1 | 1/2003 |
| EP | 0901166 A1 | 3/1999 |
| JP | 10-093017 A | 4/1998 |
| JP | 2000-349209 A | 12/2000 |
| JP | 2002-535835 T | 10/2002 |
| JP | 2002-353408 A | 12/2002 |
| JP | 2003-250278 A | 9/2003 |
| JP | 2004-031590 A | 1/2004 |
| JP | 2004-63681 A | 2/2004 |
| WO | 00/42654 A1 | 7/2000 |
| WO | 2005/109505 A1 | 11/2005 |

OTHER PUBLICATIONS

PCT—English translation of the Written Opinion of the International Search Authority as annexed to the International Search Report mailed May 19, 2005, for PCT/EP2005/000962 filed Feb. 1, 2005.

* cited by examiner

POWER SEMICONDUCTOR CIRCUIT WITH BUSBAR SYSTEM

CROSS-REFERENCE TO RELATED APPLICATION

This application is a continuation of co-pending International Application No. PCT/EP2005/000962, filed Feb. 1, 2005 which designates the United States, and claims priority to German application number DE 10 2004 018 469.0 filed Apr. 16, 2004.

TECHNICAL FIELD

The invention lies in the field of power semiconductor technology and relates to a power semiconductor circuit.

BACKGROUND

In a conventional power semiconductor circuit which is disclosed in EP 0 901 166 A1, a power semiconductor module is constructed using conventional technology by connecting one or more individual power semiconductor elements (also referred to below as power semiconductors), for example IGBTs, to the top side of an aluminum nitride substrate via a solder layer and a metalization. The underside of the substrate is connected to a cooling device in the form of a ribbed heat sink. The module comprises a plurality of such substrates which are combined in a common housing.

The power semiconductor module is externally connected, by means of a screw connection, to so-called busbars which are used to pass the currents to and from the module, the busbars also being able to run at right angles through a plurality of modules.

A new trend in module configuration is heading in the direction of flat module geometries using lamination methods as are described, for example, in the article "A High Performance Polymer Thin Film Power Electronics Packaging Technology" by Ray Fillion et al. in Advancing Microelectronics, September/October 2003.

By way of example, a substrate having a component which has a contact area can thus be provided in order to produce such a module. In this case, low-inductance contact-connection is realized by bringing the contact area together with a pad which is formed on a relatively thin film. The contact area and pad are brought together by laminating the film in a vacuum press under isostatic pressure.

SUMMARY

A power semiconductor circuit may be easy to fit and may have a particularly space-saving design by comprising a power semiconductor module which is in the form of a flat subassembly and in which at least one electronic component can be arranged on a substrate and is contact-connected to a pad of a film by way of a contact area on the top side, having a busbar system which supplies and/or dissipates current and on whose one cover busbar the power semiconductor module is arranged, and having a cooling device which is integrated in the busbar system.

BRIEF DESCRIPTION OF THE DRAWINGS

The invention will be explained in more detail below with reference to the exemplary embodiments which are illustrated in the figures of the drawing, in which.

DETAILED DESCRIPTION

Thus, the flat power semiconductor module my be directly integrated in the busbar system. In this case, the busbar system may be in the form of a busbar packet having a cover busbar, in which at least the area in which the module is intended to be arranged is flat.

The module or a plurality of flat modules may be soldered to the outside of a busbar which is in the form of a plate and is used as a positive or negative plate. This is because the positive and negative busbars are usually arranged as the topmost and bottommost plates of a plate busbar system packet. In this refinement, the modules are thus arranged on the top or bottom outer side of the busbar system.

Another advantageous aspect of the power semiconductor circuit according to an embodiment is that the cover busbar, to which the module is applied, can be directly cooled by a cooling device. Heat loss produced in the module can thus be dissipated in a particularly effective manner.

The cooling device may be in the form of an air cooling system. However, it may also be a liquid cooling system. In this case, it is advantageous if the coolant is electrically insulating. The cooling device can then be designed to be conductive and can thus carry out additional electrical functions.

Another preferred refinement according to an embodiment provides for the busbar system to be a busbar system packet comprising a plurality of conductors which are in the form of plates and are arranged such that they are insulated on parallel planes. A particularly compact design is thus realized. It is preferred, in terms of production, for the conductors which are in the form of plates to be connected to one another by means of lamination. Recourse can thus be had to the corresponding processes which are also used to produce the flat power semiconductor module. In this case, the lamination step or the additional lamination steps can also be effected simultaneously on the substrate.

The cooling device may be preferably likewise in the form of a plate and may be arranged, almost like a sandwich, between the busbars which are in the form of plates.

The power semiconductor module may be electrically connected to further layers or busbars of the busbar system via conductor tracks or conductor sheets which run laterally.

One refinement according to an embodiment which can be particularly advantageous, with respect to the contact-connection of the power semiconductor module, provides for the electronic component to be connected to the substrate by way of a contact area on the underside and for the substrate to comprise a conductive material.

Additional circuits, for example for control purposes, are frequently required in the immediate vicinity of the power semiconductor module. According to an embodiment, this can be realized by virtue of the control circuit being in the form of a flat unit and being arranged above the power semiconductor module.

Figure 1:
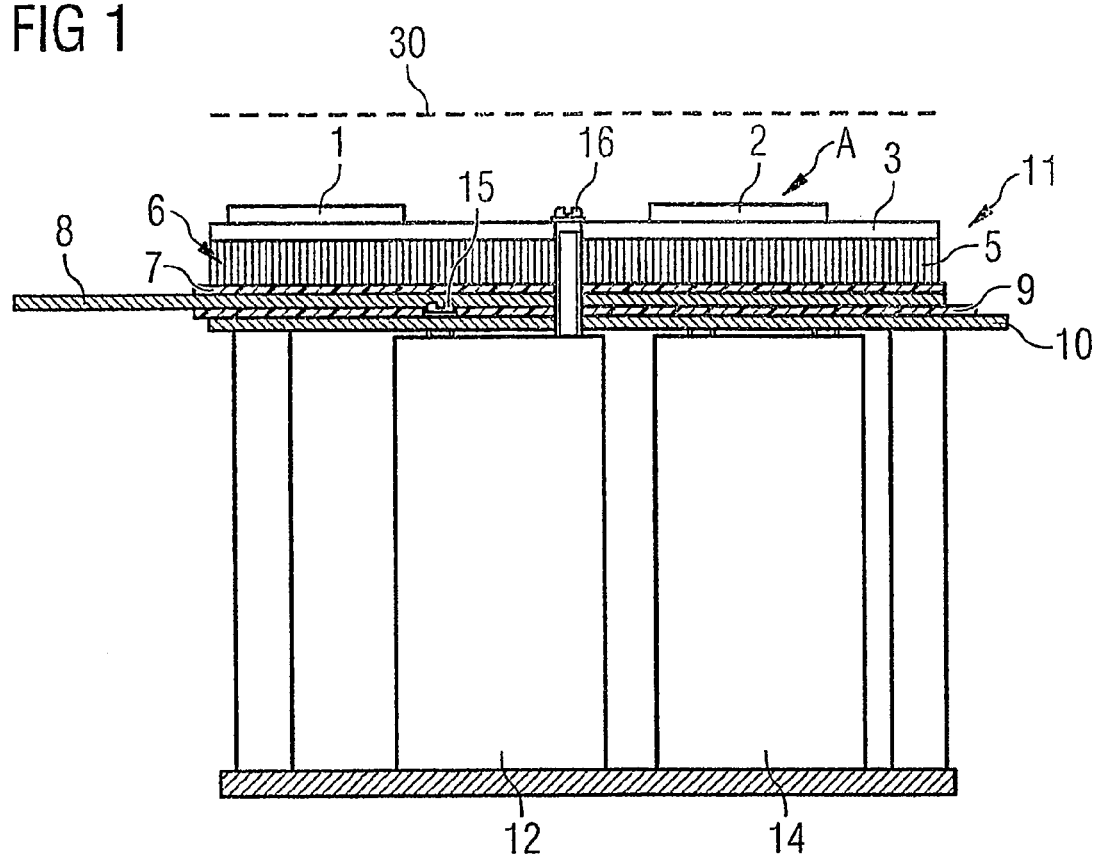
FIG. 1 shows a side view of a power semiconductor circuit according to an embodiment.

FIG. 1 shows two power semiconductor modules 1 and 2 which are arranged on the top side of a topmost busbar (cover busbar) 3. The busbar is flat and is in the form of a plate. It may be used as a positive busbar of an inverter. A cooling device 5 which may be in the form of an air cooler is situated beneath the busbar 3. However, provision is made in this case of a liquid cooling system whose coolant 6 is electrically insulating (for example oil). The cooling device is thus insulated from a housing, for example, and can thus also undertake electrical functions. The cooling device directly cools the busbar 3 and thus ensures that the heat loss produced during operation is dissipated in a very effective manner.

The cooling device 5 is arranged, like a sandwich, between the cover busbar 3 and (with the interposition of insulation 7) a further busbar 8 which is in the form of a plate and is on a parallel plane. Provision is also made of a busbar 10 on the underside with the interposition of a further insulating layer 9. This busbar 10 forms the negative busbar. The busbars 3, 8, 10 form, together with the cooling device 5, a very compact arrangement which is also referred to as a busbar system packet 11. The elements in the busbar system packet are connected to one another by means of lamination.

Two intermediate capacitors 12, 14 of an inverter, which are connected to the busbar 3 and 10 via screw connections (for example 15, 16 of the capacitor 12), are indicated under the busbar system packet.

Figure 2:
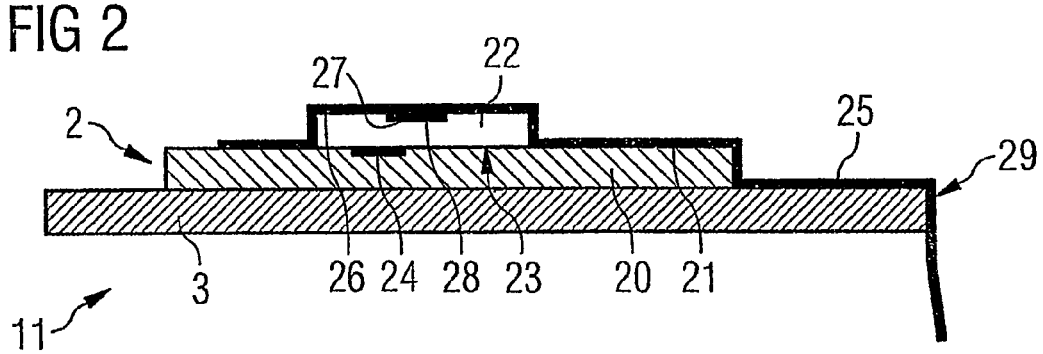
FIG. 2 shows an enlarged part from FIG. 1 in detail.

FIG. 2 shows a part in the region A of FIG. 1. A substrate 20 which comprises a conductor, for example molybdenum, can be seen. An electronic component, for example an IGBT, 22 is soldered to the top side 21 of said substrate and a connection contact area (pad) 24 is situated on the underside 23 of said component. The substrate 20 is, for its part, soldered to the busbar 3 (cf. FIG. 1 as well), with the result that the connection contact area 24 is directly electrically contact-connected to the busbar 3. A plurality of electrical components can preferably be arranged on the substrate 20 in this manner, which components are intended to be at the electrical potential of the busbar 3 in accordance with the circuit specifications.

A film 25 of the type described initially, which has been applied by means of lamination and implements electrical connections, can be seen above the component 22. These connections may also comprise, for example, electrical contact between a connection contact area 27 (pad), which is provided on the top side 26 of the component 22, and a corresponding pad 28 on the film, as described in detail in German patent application having the file reference DE 103 14 172.3. The film 25 extends beyond the module 2 to the edge 29 of the busbar system packet 11 and thus also possibly reaches pads of the other busbars. The film can be processed and laminated together with the lamination of the busbar system packet 11.

As indicated in FIG. 1, a control circuit which is in the form of a flat unit 30 on a printed circuit board is arranged above the compact unit comprising the busbar system packet 11 and the capacitors 12, 14. This circuit can be connected to the elements of the power semiconductor module and/or to the busbars via wire bonds, welded joints, press contacts or soldered joints (not illustrated).

A very compact power semiconductor circuit, for example an inverter, which can be inserted into a relatively small housing (not illustrated) is thus realized overall. The power semiconductor circuit according to an embodiment is used to make optimum full use of the space-saving possibilities which result from the flat design of a power semiconductor module which is constructed in the form of layers. Finally, a considerable advantage in this case is also that this power semiconductor circuit can manage without the power semiconductor module and busbars being connected by means of screws.

LIST OF REFERENCE SYMBOLS

1 Power semiconductor module
2 Power semiconductor module
3 Cover busbar
5 Cooling device
6 Coolant
7 Insulation
8 Busbar
9 Insulating layer
10 Busbar
11 Busbar system packet
12 Intermediate capacitor
14 Intermediate capacitor
15 Screw connection
16 Screw connection
20 Substrate
21 Top side
22 Component
23 Underside
24 Connection contact area
25 Film
26 Top side
27 Connection contact area
28 Pad
29 Edge
30 Printed circuit board
A Part

What is claimed is:

1. A power semiconductor circuit, comprising
a power semiconductor module which is in the form of a flat subassembly and in which at least one electronic component is arranged on a substrate and is contact-connected to a pad of a film via a contact area on a top side of the electronic component,
a busbar system which supplies and/or dissipates current and which comprises a cover busbar on which the power semiconductor module is arranged, the busbar system including a plurality of conductors in the form of plates arranged such that the plates are insulated on parallel planes, one of the plates being the cover busbar, and
a cooling device which is integrated in the busbar system and includes a plate interposed between the plates of the busbar system,
wherein the at least one electronic component is electrically conductive, arranged between the substrate and the film, and electrically connected to the cover busbar.

2. The power semiconductor circuit according to claim 1, wherein the cooling device directly cools the cover busbar.

3. The power semiconductor circuit according to claim 1, wherein the cooling device is a liquid cooling system.

4. The power semiconductor circuit according to claim 3, wherein the liquid coolant is electrically insulating.

5. The power semiconductor circuit according to claim 1, wherein the conductors which are in the form of plates are connected to one another by means of lamination.

6. The power semiconductor circuit according to claim 1, wherein the electronic component is connected to the substrate by way of a contact area on an underside of the electronic component and the substrate comprises a conductive material.

7. The power semiconductor circuit according to claim 1, wherein provision is made of a control circuit which is arranged, in the form of a flat unit, above the power semiconductor module.

8. The power semiconductor circuit according to claim 1, wherein the power semiconductor module and the busbar system are connected to one another without screw connections.

9. The power semiconductor circuit according to claim 1, wherein the film extends as far as the edge of the cover busbar.

10. The power semiconductor circuit according to claim 9, wherein the busbar system has, in addition to the cover busbar, at least one further busbar, the film extending as far as said further busbar.

11. The power semiconductor circuit according to claim 10, wherein the film contact-connects a pad of the at least one further busbar.

12. A power semiconductor circuit, comprising a power semiconductor module which is in the form of a flat subassembly and in which at least one electronic component is arranged on a substrate and is contact-connected to a pad of a film via a contact area on a top side of the electronic component, a busbar system which supplies and/or dissipates current and includes a first conductive busbar plate on which the power semiconductor module is arranged and a second conductive busbar plate spaced apart from the first conductive busbar plate by an insulating layer, the first and second conductive busbar plates being arranged on parallel planes, and a liquid cooling device which is integrated in the busbar system and includes a plate interposed between the first and second conductive busbar plates, wherein the liquid coolant is electrically insulating, wherein the at least one electronic component is electrically conductive, arranged between the substrate and the film, and electrically connected to the cover busbar.

13. The power semiconductor circuit according to claim 12, wherein the first conductive busbar plate, the second conductive busbar plate, the insulating layer and the liquid cooling device are connected to one another by means of lamination.

14. A power semiconductor circuit, comprising:

a first busbar;

a power semiconductor module arranged on the first busbar, the power semiconductor module having an electronic component arranged on a conductive substrate which is in contact with the first busbar;

a film laminated over the power semiconductor module and the first busbar, the film having a conductive pad contact-connected to a contact area arranged on a top side of the electronic component;

a second busbar arranged in a plane parallel with the first busbar;

a cooling device arranged between the first and second busbars; and an insulating layer arranged between the cooling device and the second busbar, wherein the electronic component is electrically conductive, arranged between the conductive substrate and the film, and electrically connected to the first busbar.

15. The power semiconductor circuit of claim 14, further comprising a third busbar arranged in a plane parallel with the first and second busbars and an additional insulating layer arranged between the second and third busbars.

16. The power semiconductor circuit of claim 15, further comprising a capacitor connected to the first and third busbars.

* * * * *